(12) United States Patent
Scott et al.

(10) Patent No.: US 9,602,747 B2
(45) Date of Patent: Mar. 21, 2017

(54) PHOTOSENSOR ARRANGEMENTS

(71) Applicant: STMICROELECTRONICS (RESEARCH & DEVELOPMENT) LIMITED, Marlow Bucks (GB)

(72) Inventors: Andrew Scott, Edinburgh (GB); Jeffrey M. Raynor, Edinburgh (GB)

(73) Assignee: STMICROELECTRONICS (RESEARCH & DEVELOPMENT) LIMITED, Buckinghamshire (GB)

( * ) Notice: Subject to any disclaimer, the term of this patent is extended or adjusted under 35 U.S.C. 154(b) by 0 days.

(21) Appl. No.: 14/674,728

(22) Filed: Mar. 31, 2015

(65) Prior Publication Data

US 2015/0326805 A1 Nov. 12, 2015

(30) Foreign Application Priority Data

May 7, 2014 (GB) .................................. 1408082.4

(51) Int. Cl.
| | |
|---|---|
| *H04N 5/3745* | (2011.01) |
| *H04N 5/217* | (2011.01) |
| *H04N 5/355* | (2011.01) |
| *H04N 5/357* | (2011.01) |
| *H04N 5/363* | (2011.01) |
| *H04N 5/361* | (2011.01) |
| *H01L 27/146* | (2006.01) |
| *H04N 5/378* | (2011.01) |

(52) U.S. Cl.
CPC ....... *H04N 5/3745* (2013.01); *H01L 27/1464* (2013.01); *H01L 27/14609* (2013.01); *H01L 27/14645* (2013.01); *H01L 27/14689* (2013.01); *H04N 5/2173* (2013.01); *H04N 5/3559* (2013.01); *H04N 5/3575* (2013.01); *H04N 5/361* (2013.01); *H04N 5/363* (2013.01); *H04N 5/378* (2013.01); *H04N 5/37457* (2013.01); *H04N 2201/3269* (2013.01)

(58) Field of Classification Search
CPC .......................... H04N 5/3745; H01L 27/1464
See application file for complete search history.

(56) References Cited

U.S. PATENT DOCUMENTS

| | | | | |
|---|---|---|---|---|
| 5,233,180 | A * | 8/1993 | Tsuruta | ................ H03K 17/785 250/208.1 |
| 2010/0157035 | A1 | 6/2010 | Purcell | |
| 2010/0276572 | A1* | 11/2010 | Iwabuchi | ............ H01L 27/1464 250/208.1 |

* cited by examiner

*Primary Examiner* — Ahmed A Berhan
(74) *Attorney, Agent, or Firm* — Slater Matsil, LLP (57) ABSTRACT

A photosensor arrangement may include an amplifier configured to receive charge from a photosensor device at a first input, and a second input configured to receive a first reference voltage. The amplifier may provide an output voltage on an output. A comparator has a first input at the output voltage, a second input at the first reference voltage and is configured to provide a compare output. A capacitor is configured to have a first plate coupled to the output of the amplifier and a second plate coupled to the first input of the comparator.

36 Claims, 7 Drawing Sheets

PHOTOSENSOR ARRANGEMENTS

FIELD OF THE INVENTION

Some embodiments relate to photosensor arrangements.

BACKGROUND

Noise is one of the factors that may determine the performance of a photosensor arrangement. A photosensor arrangement may be referred to as a pixel.

The full well capacity of a photosensor refers to the total amount of charge that can be stored in the photosensor before overflowing into adjoining photosensors. Since this feature is a result of the photocharge being stored on a capacitor, which is in turn dependent on pixel area, the full well capacity of a photosensor is dependent on its physical size.

Dynamic range is defined as the maximum signal strength detectable by a photosensor divided by the noise in the photosensor. The maximum detectable signal strength by a photosensor is determined by the full well capacity of the photosensor. Furthermore, the noise in the photosensor is the sum of dark and read noise components. In other words, the dynamic range of a photosensor may be described by equation (1) below.

$$\text{Dynamic Range} = \text{Full well capacity} / \sqrt{\text{Dark Noise}^2 + \text{Read Noise}^2}$$

Responsivity is a measure of the effectiveness of a photosensor in converting incident electromagnetic radiation into electrical current or voltage, and is inversely related to the capacitance of the photosensor.

There are three main sources of noise that contribute to the degradation of the quality of an image: photon shot noise, dark noise and read noise.

Photon shot noise results from natural fluctuations in the number of photons detected by a photosensor and is caused by the quantum statistical nature of photon emission and detection. This randomness is manifested as a temporal and spatial fluctuation in the signal produced by the photosensor. Photon shot noise occurs even with an ideal noise-free light source and an ideal noise-free photosensor.

Read noise is a combination of system noise components inherent in the conversion of photo generated charge carriers into a measurable signal; processing of the resulting signal; and analog-to-digital (A/D) conversion thereof.

Reset noise is one of the major noise sources when in dark conditions.

SUMMARY

According to one aspect, there is provided a photosensor arrangement comprising an amplifier configured to receive charge from a photosensor device at a first input and a second input configured to receive a first reference voltage. The amplifier provides an output voltage on an output. A comparator has a first input at the output voltage, and a second input at the first reference voltage and is configured to provide a compare output. A capacitor is configured to have a first plate coupled to the output of the amplifier and a second plate coupled to the first input of the comparator.

The photosensor arrangement may comprise reset circuitry configured to reset the amplifier and the comparator.

The photosensor arrangement may be configured such that after reset of the photosensor arrangement device, the output voltage comprises the first reference voltage plus an offset voltage and the second voltage is at the first reference voltage.

The photosensor arrangement may be configured in use to have back side illumination and the capacitor may be configured to overlie, at least partially, a photodiode of the photosensor arrangement on a side of the photodiode opposite to a side on which light impinges, in use.

The capacitor may be a metal dielectric metal capacitor.

The photosensor arrangement may comprise a feedback path between the comparator output and the first input of the comparator.

The photosensor arrangement may comprise a switch in the feedback path, with the switch being configured to be controlled by the reset circuitry.

The second input of the comparator may be configured to receive one of the first reference voltage and a second reference voltage.

The second reference voltage may be higher than the first reference voltage.

The second reference voltage may be used when the photodiode is being read.

The photosensor arrangement may comprise circuitry configured to have the comparator output as a first input and a disable signal provided by the reset circuitry as a second input. The circuitry may be configured to prevent the comparator output being used to provide a count value when the reference voltage on the second input to the comparator is being changed from the first to second reference voltage. The circuitry may comprise a NOR gate.

The photosensor arrangement may comprise a feedback path between the output and the first input of the amplifier.

The photosensor arrangement may comprise a switch in the feedback path of the amplifier. The switch may be configured to be controlled by the reset circuitry.

Another aspect is directed to an integrated circuit or die comprising at least one photosensor arrangement as previously described. Yet another aspect is directed to a device comprising at least one photosensor arrangement as previously described. The device may be a camera. The device may comprise a display on which to display the captured image.

BRIEF DESCRIPTION OF THE DRAWINGS

Some embodiments will now be described by way of example only, with reference to the accompanying Figures in which.

DETAILED DESCRIPTION

Figure 1:
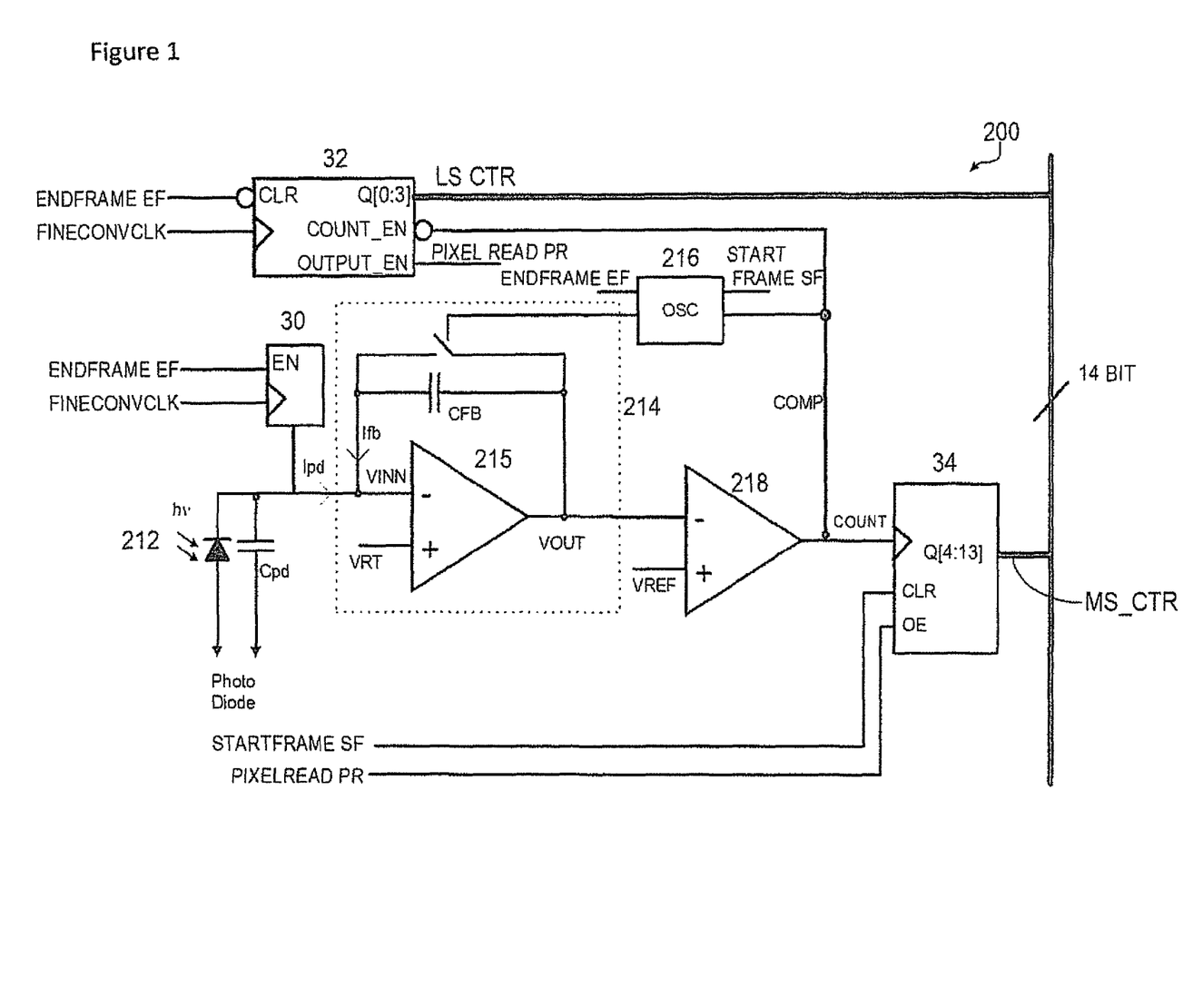
FIG. 1 is a circuit diagram of a photosensor arrangement as in accordance with the invention.

Referring to FIG. 1, the photosensor arrangement 200 comprises a photodiode 212 coupled to a charge injector 30. The charge injector 30 is in turn coupled to a secondary counter 32 (which produces an output signal LS_CTR) and a charge integrator circuit 214 comprising a feedback capacitor CFB and an amplifier 215. The amplifier 215 includes two inputs, namely an inverting input VINN and a reset input VRT. The charge integrator circuit 214 is coupled to a monostable oscillator 216 and a comparator 218. The voltage output VOUT of the amplifier 215 is provided as a first input to the comparator 218. A reference voltage VREF is provided as a second input to the comparator. The comparator 218 in turn provides a COUNT output as an input to a primary counter 34 that produces an output signal MS_CTR. The output of the comparator also provides an input to the oscillator, with this output being referenced COMP.

On demand, the charge injector 30 generates a specified amount of charge that is significantly less than that needed to increment the primary counter 34 by one count. For example the charge injector 30 may produce approximately $\frac{1}{16}$th of the charge required to increment the primary counter 34 by one count.

Figure 4:
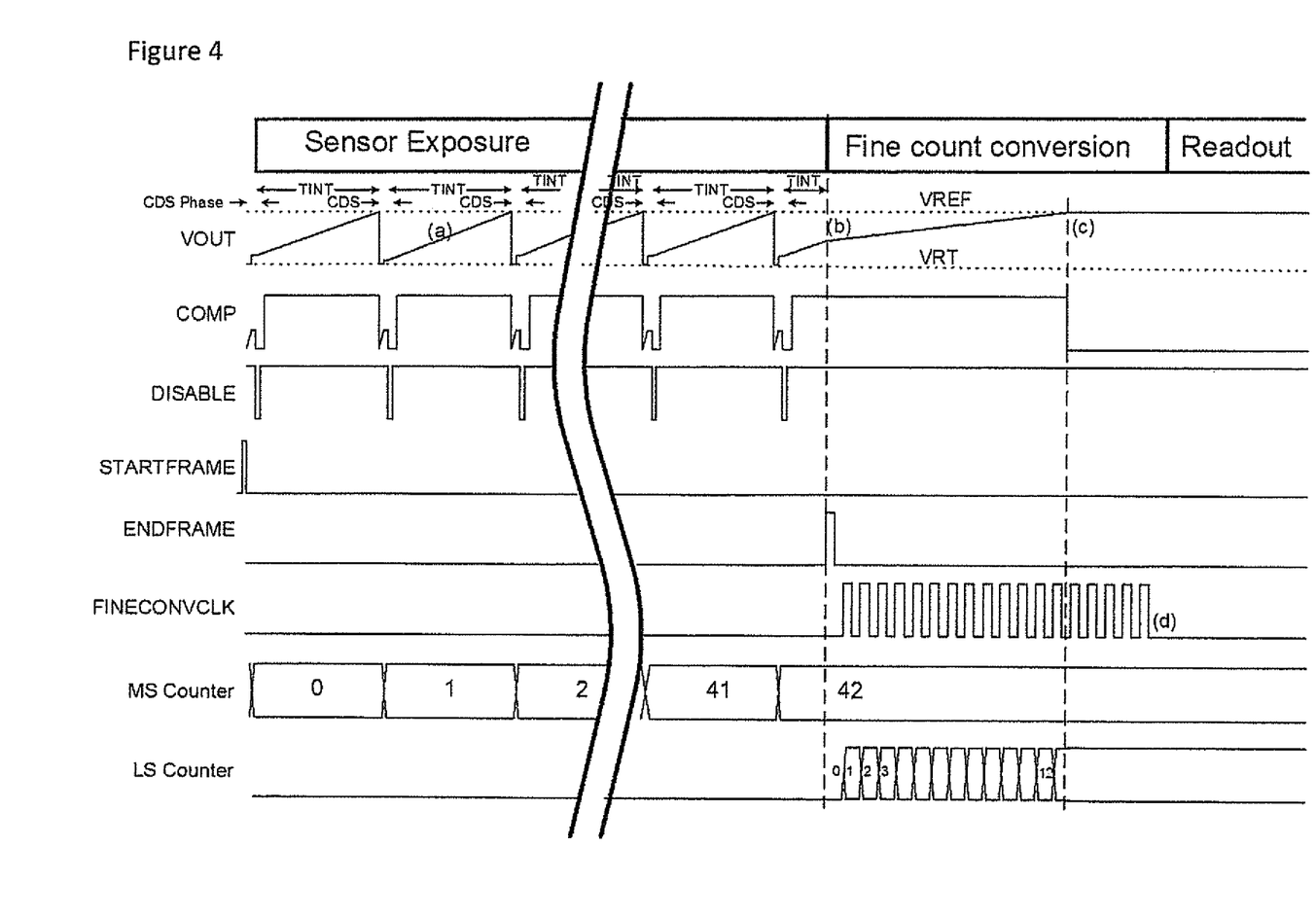
FIG. 4 shows an overview timing diagram of the photosensor arrangement of FIG. 2.

The photosensor arrangement 200 may have three operational phases as shown in FIG. 4: a sensor exposure phase, a fine count conversion phase and a readout phase. In FIG. 4, the first line shows the output VOUT of the amplifier, the second line shows the output COMP of the comparator, the third line shows a DISABLE signal (this will be described in relation to the embodiment of FIG. 2), the fourth line shows a STARTFRAME signal which is provided as an input to the oscillator 216 and the primary counter 34; the fifth line shows an ENDFRAME signal which is provided as an input to the oscillator 16, the charge injector 30 and the secondary counter 32, the sixth line a FINECONVCLK clock signal which is provided as an input to the secondary counter 32 and the charge injector 20, the seventh line shows the output MS_CTR of the primary counter 34 and the last line shows the output LS CTR of the secondary counter 32.

The sensor exposure phase of the photosensor arrangement 200 is now described. At the start of the illumination phase, before radiation has been emitted from a radiation source (not shown), the STARTFRAME (SF) signal is transmitted to the oscillator. The STARTFRAME signal is also transmitted to the primary counter 34 to reset it. The STARTFRAME signal is also transmitted to the charge integrator circuit 214 which causes the capacitor CFB to be discharged and the output voltage of the amplifier to be the reset voltage VRT. The STARTFRAME signal is generated externally (not shown). When radiation is emitted from the radiation source (not shown) and the photosensor arrangement 200 is illuminated thereby, the charge integrator 214 detects the photo generated charge produced in the photodiode 212 and the feedback capacitor CFB produces a ramp signal VOUT. When the output from the charge integrator 214 reaches a threshold VREF (set externally to the photosensor arrangement 200), an output (COMP/COUNT) from the comparator 218 is switched high. The primary counter 34 counts the pulses in the comparator's output signal (COMP) by incrementing the output signal MS_CTR.

The exposure phase is ended by the cessation of the illumination source; the obscuration of the illumination source (e.g., by a shutter); or the cessation of charge collection (e.g., by disconnecting the photodiode 212 from the charge amplifier 215).

After the end of the exposure phase, the fine count conversion phase is commenced. During the fine conversion phase, the output voltage (VOUT) from the charge integrator 214 is most likely to have a value part-way between the reset voltage VRT and the threshold voltage VREF. This part-way state will be known as a partial threshold state. The photosensor arrangement 200 may measure such voltages.

More particularly, the start of the fine-conversion phase is indicated by the assertion of the ENDFRAME (EF) signal. The ENDFRAME (EF) signal has two functions: inhibiting further resets of the charge integrator 214; and resetting the secondary counter 32.

The fine conversion clock signal (FINECONVCLK) is then emitted in a pulsed fashion, wherein each pulse causes the charge injector 30 to inject a succession of small charge into the charge integrator circuit 214. Accordingly, each injection from the charge injector 30 causes the output voltage (VOUT) from the charge integrator 214 to increase.

Each injection from the charge injector 30 is accompanied by an increment to the output (LS_CTR) of the secondary counter 32. After a number of charge injections from the charge injector 30, the output voltage (VOUT) of the charge integrator 214 reaches the comparator's threshold voltage (VREF) and the COMP signal is set low.

It will be appreciated that some embodiments will comprise more than one photosensor arrangement, arranged in an array. The clocking system (CLK) may need to supply enough pulses to ensure that the output voltage (VOUT) of every photosensor arrangement 200 has reached the threshold voltage (VREF). Consequently, even when a COMP signal is set low for a single photosensor arrangement 200, the clock pulses (CLK) continue to be emitted to supply the remaining photosensor arrangements 200, if required.

However, once a COMP signal has been emitted for a given photosensor arrangement 200, the secondary counter 32 for the photosensor arrangement 200 is disabled (i.e., so that it is not further incremented by the continuing train of clock pulses [FINECONVCLK]). In addition, the reset signal for the charge-integrator 214 of the photosensor arrangement 200 is disabled, so that the COMP signal remains asserted.

The output signal from the photosensor arrangement 200 is read out. In particular, the output signal (MS_CTR) from the primary counter 34 is related to the charge generated in the photodiode 212. More specifically, if the primary counter 34 has an output value (MS_CTR) of N, then the amount of charge (Qpd) generated by the photodiode 212 is given by:

$$Qpd=N*(VREF-VRT)*CFB$$

Alternatively, the number of photoelectrons (Ne_MScount) generated in the photodiode 212 and detected by the primary counter 34 is approximately given by:

$$Ne\_MScount=N*(VREF-VRT)*CFB/e$$

Where e is the charge on each electron (1.6E-19C).

If the secondary counter 32 has an output value of M, then the amount of charge (Qinject) injected by the charge injector 30 into the charge integrator circuit 214 is given by:

$$Qinject=M\times Qi,$$

where Qi is the amount of charge injected onto input VINN on each pulse of the clocking signal (FINECONVCLK).

As Qinject is the amount of charge required to cause the charge integrator's 214 output (VOUT) to reach the threshold voltage (VREF), the charge stored (Qfb) on the feedback capacitor CFB at the end of the exposure phase (P0) is given by:

$$Qfb=(VREF-VRT)*CFB-M*Qi$$

Alternatively, the number of electrons (Ne_LScount) generated in the photodiode 212 and detected by the secondary counter 32 (i.e., that are a fraction of the number required to increment the primary counter 34) is given by:

$$Ne\_LScount=((VREF-VRT)*CFB-M*Qi)/e$$

Hence, the total number of electrons (Ne_total) generated in the photodiode 212 during the illumination phase can be determined by combining the number of electrons determined by the primary and secondary counters 34, 32 as follows:

$$Ne\_total=Ne\_MScount+Ne\_LScount$$

Using the above formulation, Ne_total can be alternatively expressed as:

$$Ne\_total=((N*(VREF-VRT)*CFB)+((VREF-VRT)*CFB-M*Qi))/e$$

Figure 2:
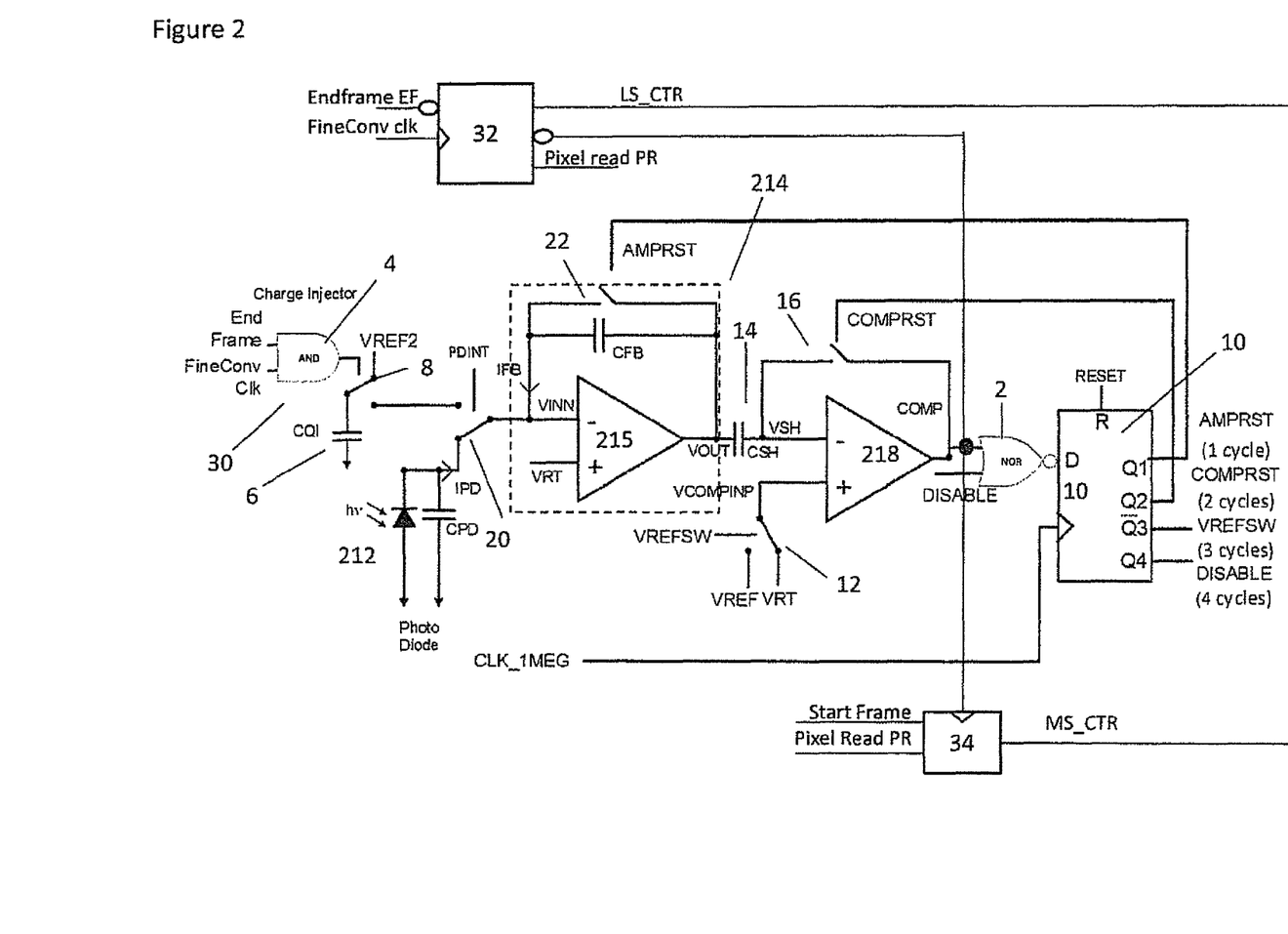
FIG. 2 is a circuit diagram of a photosensor arrangement according to another embodiment in accordance with the invention.

Reference is made to FIG. 2 which shows a modification to the arrangement of FIG. 1, according to an embodiment. Embodiments may use CDS (correlated double sampling) in a photon counting pixel. This may allow the reset noise and/or offsets of the amplifier and the comparator to be removed. The reset noise may be a major noise source in dark conditions. Removing the reset noise and amplifier input offset when resetting the amplifiers may allow the pixel to achieve a larger dynamic range.

The reset noise is sampled onto a capacitor 14 to be held for the duration of the integration time resulting in subtracting the reset and offsets from the signal. The offsets may be one or more of the input offset voltages from the amplifier 215 and the comparator 218. This capacitor is arranged between the output of the charge amplifier 215 and the input to the comparator 218.

The capacitor 14 as a metal-dielectric metal capacitor is required as both terminals are "floating" (i.e. not connected to a fixed voltage such as ground, supply or other fixed voltage). This can be difficult to fit into a pixel in front side illumination (FSI). This is because the metal of the capacitor should not cover the photodiode. However it should be appreciated that some embodiments are useful in some FSI pixels. If back side illumination (BSI) is used, the capacitor can be placed over the photodiode due to the BSI process as the metal layers are placed on the opposite side to where the light impinges on the sensor. The dielectric may be an oxide.

In this example the charge injector 30 comprises an AND gate 4 which receives a first input which is the end of frame signal ENDFRAME and a second signal which is the FINECONVCLK signal. The charge injector 30 also has a capacitor 6 and a voltage reference VREF2. When the capacitor is coupled to VREF2, charge is stored on the capacitor. When the capacitor is coupled to the VINN input of the charge amplifier 215, the capacitor is discharged to the VINN input. The position of the switch 8, and hence whether the capacitor is coupled to VINN or VREF2 is controlled by the output of the AND gate. The capacitor will normally be coupled to the reference voltage unless the output of the AND gate is high in which case the capacitor will be coupled to the input of the charge amplifier. This will be in the fine conversion phase when the end of frame signal is asserted and each clock pulse will cause the charge injector to inject a small amount of charge into the charge amplifier 215.

A switch 20 is provided so that VINN is either coupled to the capacitor 6 or the photodiode 212. This is controlled by signal PDINT which will be discussed later with reference to FIG. 3. The signal PDINT will cause the photodiode to be coupled to the input of the charge amplifier in the read phase and the capacitor 6 to be coupled to the input of the charge amplifier during the fine conversion phase as discussed above.

With the arrangement of FIG. 2, both coarse and fine counting are provided by primary and secondary counters 34 and 32 as described in relation to FIG. 1. The offsets from the amplifiers are taken out for coarse counting. The COMP signal is used to increment the coarse (primary) counter (as for FIG. 1) and the FINECONVCLK clock signal is used to increment the fine (secondary) counter During the first cycle of the CDS phase, both the charge integrator (214) and the comparator 218 are held in reset and so their outputs are approximately VRT+input offset voltage. The charge integrator 214 is released from reset at the start of the second cycle of the CDS phase and the voltage VOUT is then VRT+input offset voltage of amplifier 215+reset noise (RSTNOISE). This voltage (VOUT) is on one side of the storage capacitor 14 and the voltage on the other side of the storage capacitor 14 VSH is VRT+input offset voltage of comparator 218. At the end of the second cycle of the CDS phase the comparator 218 is released from reset by the signal COMPRST and so the voltage across the storage capacitor 14 is set by the input offset voltage of amplifier 215, the input offset voltage of the comparator 218 and the reset noise (RSTNOISE). As neither the charge integrator 214 nor the comparator 218 are in reset, the pixel is now light-sensitive again, i.e. in its integrating phase. However, the voltage VCOMPINP at the non-inverting input of the comparator 218 is at the reset voltage VRT and not at the appropriate voltage (VREF) for operation, so at the end of the third cycle of the CDS phase VREFSW goes high to couple VCOMP-INP to VREF. This CDS technique cancels the reset noise and input offset voltages, but during this process spurious signals from the comparator 218 may be generated. Hence it may be necessary to inhibit these signals, otherwise they may cause the coarse counter to erroneously increment or erroneously re-trigger a logic block 10.

A NOR gate has a first input provided by the output of the comparator 18 and a second input provided by a disable signal. The output of the NOR gate is provided to an input of the logic block. The logic block also has a clock input which receives a clock signal which may be of the order of 1 MHz. The logic block may generate the required reset signals. The logic block 10 provides a first output which is a reset signal AMPRST for the charge integrator 214. In particular the reset signal AMPRST is used to control a switch 22 of the charge integrator arranged in a parallel feedback path to the feedback path having the feedback capacitor CFB.

The logic block has a second output which provides a reset signal COMPRST for the comparator 218. The reset signal is used to control a switch 16 provided in a feedback path between the comparator output and its input.

The logic block has a third output which provides a signal VREFSW which is used to control a switch 12. The switch 12 is used to couple VREF or VRT to the reference input of the comparator 218.

Figure 3:
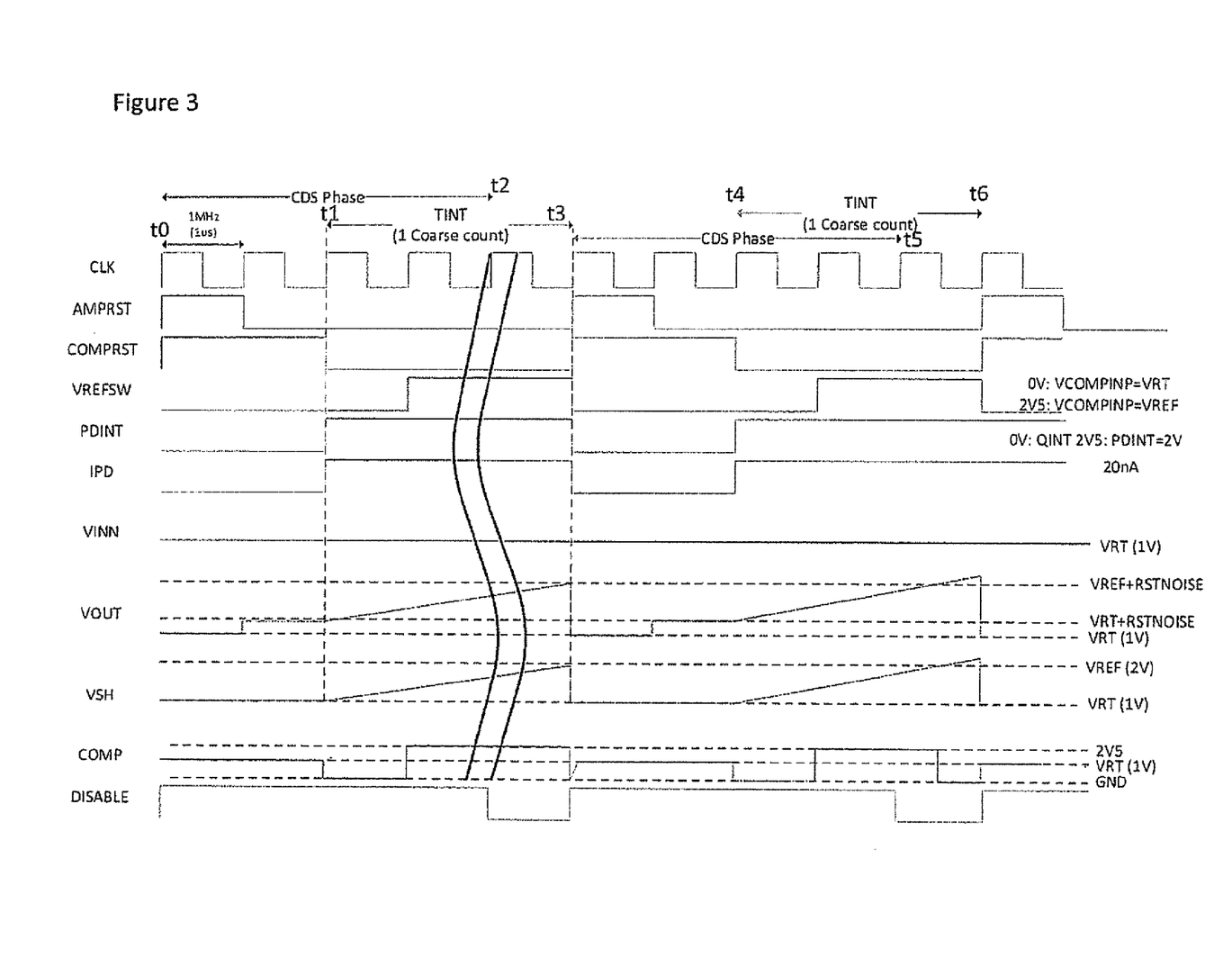
FIG. 3 is a timing diagram of the photosensor arrangement of FIG. 2.

The fourth output of the logic block 10 provides a disable signal. It should be appreciated that the logic block is configured to output the signals in correct order, as shown in FIG. 3.

In some embodiments, a high dynamic range which may be relatively close of to that of the eye (150 dB equivalent to approximately 25 bits) may be achieved.

Some embodiments may perform photon counting which counts the number of coarse counts. A coarse count for a pixel may be defined as the amount of charge produced by the photodiode 212 which causes the output VOUT of the charge integrator 214 to change from its reset voltage (nominally VRT) by a swing of VREF-VRT, such that the comparator 218 COMP signal is activated. This enables the reset logic of the logic block 10 and also increments the coarse counter.

However, resetting of the charge amplifier 215 is not noise-free as resetting of capacitors (CFB and CPD) generate noise and so the voltage VOUT of the charge amplifier 215 will vary from each reset phase to the next reset phase. Systematic errors, such as input-offset voltages of the amplifiers 215 and 218 may be constant from one reset phase to another, but the input-offset voltages will vary from pixel to pixel.

If these variations in the voltage of VOUT at reset are not corrected, then the amount of photo-generated charge that is required to change the output of the charge integrator 214 such that the comparator 218 COMP signal is activated will also vary. This variation of the amount of charge required for each coarse count may be a significant source of noise, degrading the accuracy of the measurement of charge and hence illumination levels.

The correlated double sampling CDS may remove input offsets and reset noise from the system. Removing the readout noise may be advantageous due to an increasing problem for high light levels situations where multiple resets (each coarse count) are needed. For CDS the reset noise and input offsets are sampled onto a capacitor (CSH).

Figure 5A:
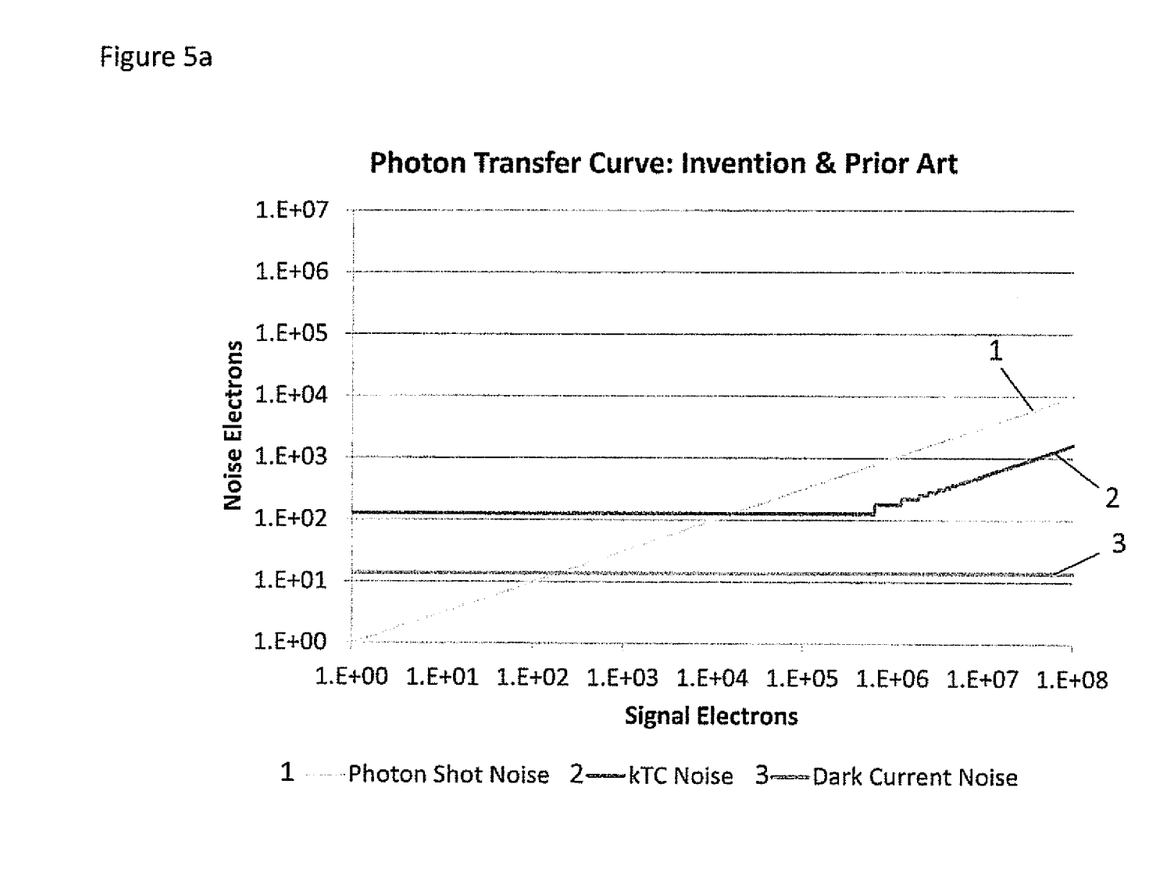
FIGS. 5a and 5b show graphs of the noise generated for each photo generated charge collected.
Figure 5B:
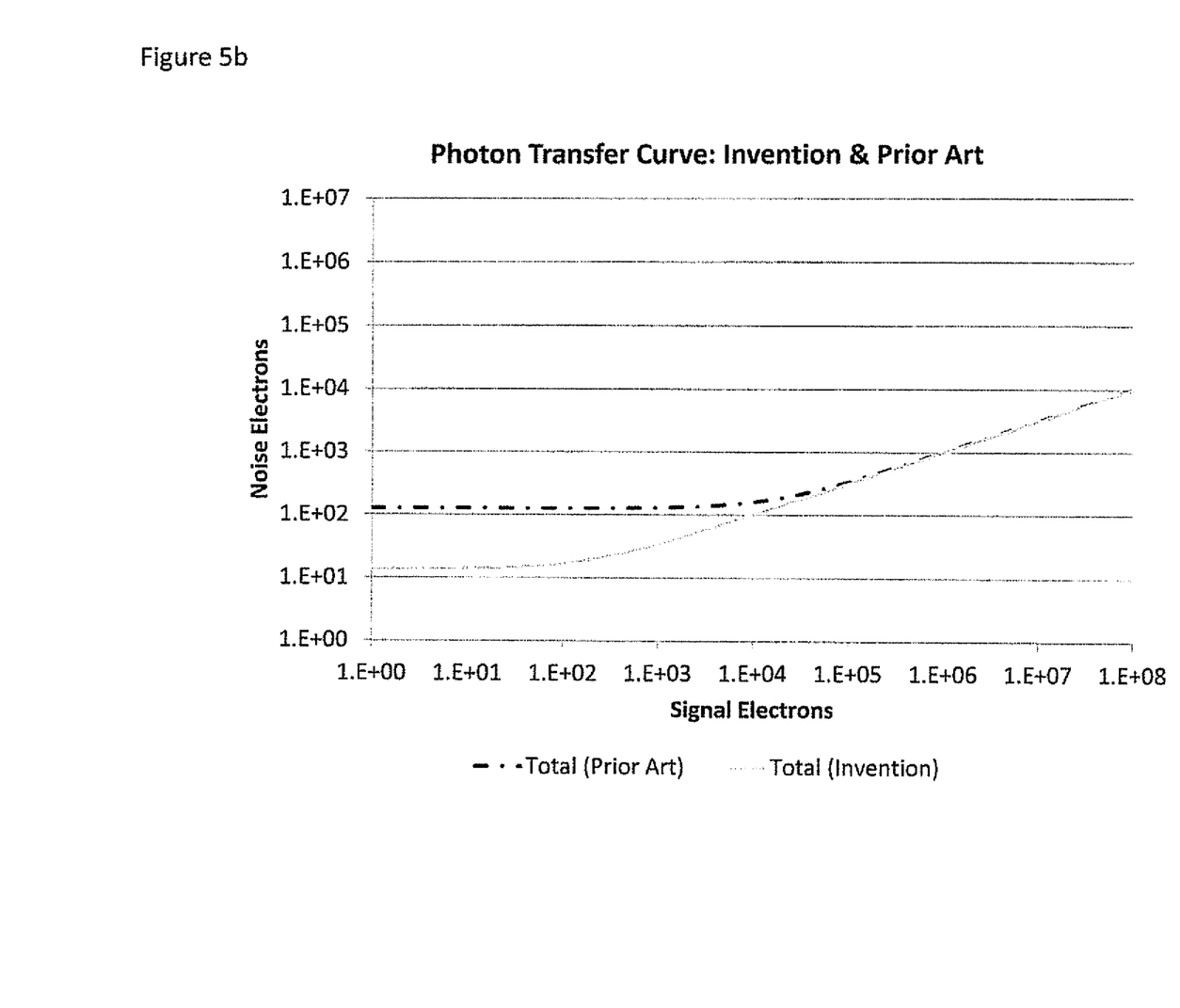

Reference is made to FIGS. 5a and 5b. FIGS. 5a and 5b show a graph of signal electrons on the x axis and noise electrons on the y axis. The graphs thus show the photon transfer curve, i.e. the noise generated (in electrons) for each photo-generated charge collected (also in electrons). For convenience, this is plotted on a log-log graph. The graph of FIG. 5a shows the photon shot noise (referenced 1) which increases as the signal electrons increase. The graph also shows kTC noise (referenced 2) from resetting the charge integrator and dark current noise (referenced 3). The graph of FIG. 5b shows the total noise in the dashed black curve for a systems (i.e. including kTC noise) which does not use an embodiment and the solid line is the noise for some embodiments. As can be seen, some embodiments remove the kTC noise. It can be seen that at low light levels (i.e. signal electrons <1E4), some embodiments provide approximately 20 dB reduction in noise.

Reference is made to FIG. 3 which shows a timing diagram. The first line shows the clock signal. The second line shows the AMPRST signal. The third line shows the COMPRST signal while the fourth line shows the signal VREFSW. The fifth line shows the signal PDINT while the sixth line shows the signal IPD. The signal IPD is the current produced by the photodiode. The seventh line shows VINN, the input to the charge amplifier, while the eighth line shows the output voltage VOUT of the charge amplifier. The ninth line shows the voltage VSH (the voltage on a plate of the capacitor VSH) at the input to the comparator while the tenth line shows the output voltage of the comparator 218 COMP. The last line shows the DISABLE signal output by the logic block 10.

Between time t0 and t2, the CDS is performed. The first coarse count is between time t1 and time t3 with time t2 being between time t1 and t3. The reset is between time t3 and time t5 with a second coarse count being between time t4 and t6. Time t5 is between times t4 and t6.

The clock signal is shown in line 1 and there are two clock cycles in the time t0 to time t1. Initially the AMPRST signal is high for one clock cycle and the goes low on the next clock cycle. This will cause the output voltage VOUT of the amplifier to change from the value VRT to VRT+reset noise.

The signals VREFSW, PDINT, IPD, VINN and VSH are all low between time t0 and t1. The output COMP of the comparator 218 is at VRT between t0 and t1.

Thus the amplifier 215 is held in reset (with AMPRST enabled high) for one clock cycle, allowing the amplifier offsets to be learnt. During this time the comparator is held in reset (COMPRST enabled high) and continues to be held in reset for an extra clock cycle. During the second clock cycle when the AMPRST is disabled (goes low) the reset noise and input offset of the amplifier is sampled onto one plate of the capacitor CSH. The other plate (VSH) of the capacitor CSH is held at the reference voltage VRT of the comparator until the second clock cycle is over.

There is one clock cycle between time t1 and time t2. At time t1, the COMPRST is disabled (low). PDINT and IPD go high. VCOMP will go low for one clock cycle until time t2. Due to VCOMPINP switching one clock cycle later, flip flops in the logic block may have to be disabled until VREFSW is 1. This is so an early COMP does not trigger a reset. This reset logic in logic block 10 has to be disabled because when the comparator comes out of reset it is possible for the comparator to fire. This may occur if the amplifier output rises above VRT before voltage comparison input was switched to VREF from VRT. If this were to happen it would be possible for the pixel to get into a locked up state where it would constantly be in a reset state.

The output voltage VOUT of the amplifier 218 will start to increase as will the voltage VSH on the capacitor CSH.

There are various clock cycles between time t2 and t3. For a lower intensity of light on the pixel there may be more clock cycles here and fewer clock cycles for a higher intensity of light. At time t2, the output voltage COMP of the comparator will go high. The voltage VSH on the capacitor CSH and the output voltage VOUT of the amplifier increase between time t1 and t3. The output voltage VOUT of the amplifier will increase to VREF+reset noise and the voltage VSH on the second plate of the capacitor will increase to VREF.

Thus as integration is started photo current is pulled from the feedback capacitor CFB increasing the output voltage VOUT of the amplifier. This will cause the voltage VSH on the second plate of the capacitor CSH to increase at the same rate as the first plate, conserving the potential difference across the capacitor.

The reference voltage input to the comparator then has to be changed (under the control of VREFSW) to give the VREF-VRT swing for the coarse count. The NOR gate resets during the transitional period when the reference voltage is changing. If the NOR gate or similar circuitry is not provided, the pixel will get stuck in a continuous loop where the pixel is constantly being reset, as discussed above. Once VSH reaches VREF then the comparator 218 fires. The output voltage COMP of the comparator 218 will go low at time t3, when VSH and VREF are the same. This means that the output of the NOR gate will be high. This enables the reset logic and resets the pixel for the next coarse count.

Thus at time t3, the AMPRST signal goes high for one clock cycle. The COMPRST goes high for two clock cycles (until time t4). There are two clock cycles between time t3 and t4. VREFSW is low from time t3 to time t5, time t5 being a few clock cycles after time t3. VREFSW will stay high until time t6 which is a clock cycle later than time t5. PDINT and IPD are both low between times t3 and t4 and then go high.

The output voltage VOUT of the amplifier 215 is VRT for one clock cycle from time t3. The output voltage VOUT is then VRT plus reset noise for one clock cycle, to time t4.

VOUT then increases between time t4 and t6 to VREF plus reset noise. The voltage VSH on the second plate of the capacitor CSH is VRT from time t3 to time t4 and then increases from time t4 to time t6 until it reaches a value of VREF. The output voltage COMP of the comparator 218 is VRT from just after time t3 to time t4 and then is at ground for one clock cycle. COMP is then at the a supply voltage until just before time t6 when that voltage goes low causing the logic block to trigger the reset signals as discussed previously.

Figure 6:
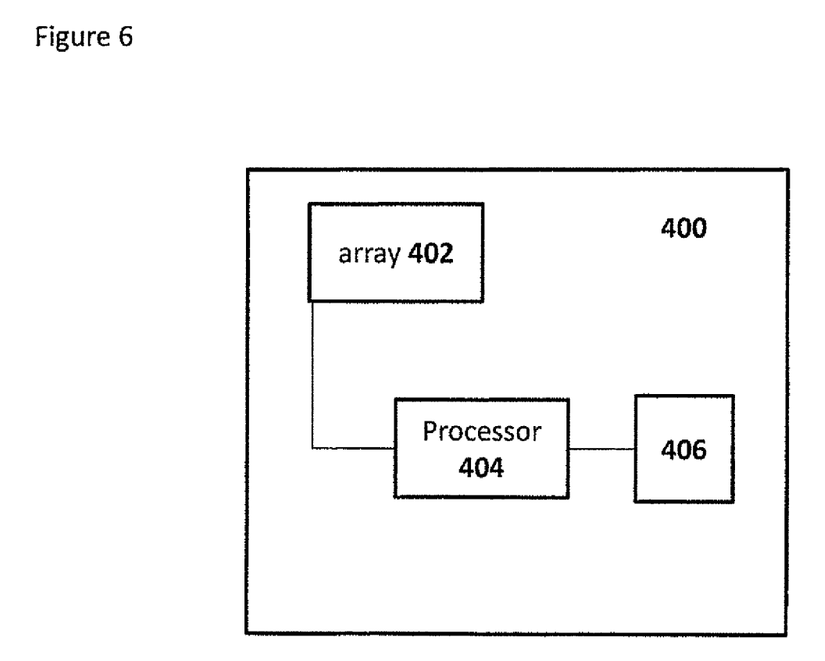
FIG. 6 shows a device in which some embodiments may be provided.

Some embodiments may be provided in a device 400 such as shown in FIG. 14. The device 400 may comprise one or more of photosensor arrangements as previously described which are referenced 402. An array of the photosensor arrangements maybe provided. An output from the array may be provided to a processor 404. The output of the processor may control for example a display 406 and allow the captured image to be displayed. In some devices, the display may be omitted and the device provides an output which can be stored and/or displayed by another device.

Embodiments can be used in any suitable imaging device. The image device can be used with a wide range of different types of electromagnetic radiation. By way of example only some embodiments may be used with visible or X-ray radiation. By way of example only, the imaging device may be a camera or an x-ray sensor. The camera may be any suitable camera and by way of example only may be a digital single-lens reflex camera. Some embodiments may be suitable for applications which require a very large dynamic range.

One or more photosensor arrangements may be provided by one or more integrated circuits or one or more dies.

Various embodiments with different variations have been described here above. It should be noted that those skilled in the art may combine various elements of these various embodiments and variations. Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

That which is claimed:

1. An electronic device comprising:
 a photosensor device comprising a photodiode;
 an amplifier having a first amplifier input, a second amplifier input and an amplifier output, the amplifier configured to receive a charge from the photosensor device on the first amplifier input, receive a first reference voltage on the second amplifier input, and provide an output voltage on the amplifier output;
 a comparator having a first comparator input, a second comparator input and a comparator output, the comparator configured to receive the output voltage on the first comparator input, receive the first reference voltage on the second comparator input, and provide a compare output on the comparator output;
 a feedback path between the comparator output and the first comparator input; and
 a capacitor adjacent the photodiode and having a first plate and a second plate, with the capacitor configured to have the first plate coupled to the amplifier output and the second plate coupled to the first comparator input.

2. The electronic device according to claim 1, further comprising reset circuitry configured to reset the amplifier and the comparator.

3. The electronic device according to claim 2, wherein the amplifier and comparator are configured so that after reset thereof, the output voltage equals the first reference voltage plus an offset voltage, and a second voltage is at the first reference voltage.

4. The electronic device according to claim 1, wherein the capacitor comprises a metal-dielectric-metal capacitor.

5. The electronic device according to claim 1, further comprising reset circuitry coupled to the amplifier and comparator; and wherein the feedback path comprises a switch configured to be controlled by the reset circuitry.

6. The electronic device according to claim 1, wherein the second comparator input is configured to receive one of the first reference voltage and a second reference voltage.

7. The electronic device according to claim 6, wherein the second reference voltage is higher than the first reference voltage.

8. The electronic device according to claim 6, wherein the second reference voltage is used when the photosensor device is being read.

9. The electronic device according to claim 8, further comprising reset circuitry coupled to the amplifier and comparator; and circuitry having a first circuitry input and a second circuitry input, wherein the circuitry is configured to have the compare output received on the first circuitry input and a disable signal provided by the reset circuitry received on the second circuitry input, and wherein the circuitry is configured to prevent the compare output from being used to provide a count value when the reference voltage on the second comparator input is being changed from the first to second reference voltage.

10. The electronic device according to claim 9, wherein the circuitry comprises a NOR gate.

11. The electronic device according to claim 1, further comprising a feedback path between the amplifier output and the first amplifier input.

12. The electronic device according to claim 11, further comprising reset circuitry coupled to the amplifier and comparator; and wherein the feedback path comprises a switch configured to be controlled by the reset circuitry.

13. The electronic device according to claim 1, further comprising a semiconductor substrate; and wherein the photosensor device, amplifier, comparator and capacitor are formed on the semiconductor substrate so that the electronic device comprises an integrated circuit.

14. The electronic device according to claim 1, wherein the photosensor device, amplifier, comparator and capacitor define a camera; and further comprising a display coupled to the camera.

15. An electronic device comprising:
 a photosensor device comprising a photodiode;
 an amplifier having a first amplifier input coupled to the photosensor device, a second amplifier input coupled to a first reference voltage, and an amplifier output;
 a comparator having a first comparator input and a comparator output;
 a feedback path between the comparator output and the first comparator input; and
 a capacitor adjacent the photodiode and having a first plate coupled to the amplifier output, and a second plate coupled to the first comparator input.

16. The electronic device according to claim 15, further comprising reset circuitry configured to reset the amplifier and the comparator.

17. The electronic device according to claim 16, wherein the amplifier and comparator are configured so that after reset thereof, output voltage at the amplifier output equals the first reference voltage plus an offset voltage, and a second voltage is at the first reference voltage.

18. The electronic device according to claim 15, wherein the capacitor comprises a metal-dielectric-metal capacitor.

19. The electronic device according to claim 15, further comprising reset circuitry coupled to the amplifier and comparator; and wherein the feedback path comprises a switch configured to be controlled by the reset circuitry.

20. The electronic device according to claim 15, wherein said comparator has a second comparator input configured to receive one of the first reference voltage and a second reference voltage.

21. The electronic device according to claim 20, wherein the second reference voltage is higher than the first reference voltage.

22. The electronic device according to claim 20, wherein the second reference voltage is used when the photosensor device is being read.

23. The electronic device according to claim 15, further comprising a feedback path between the amplifier output and the first amplifier input.

24. The electronic device according to claim 23, further comprising reset circuitry coupled to the amplifier and comparator; and wherein the feedback path comprises a switch configured to be controlled by the reset circuitry.

25. The electronic device according to claim 15, further comprising a semiconductor substrate; and wherein the photosensor device, amplifier, comparator and capacitor are formed on the semiconductor substrate so that the electronic device comprises an integrated circuit.

26. The electronic device according to claim 15, wherein the photosensor device, amplifier, comparator and capacitor define a camera; and further comprising a display coupled to the camera.

27. A method for making an electronic device comprising:
forming on a semiconductor substrate a photosensor device comprising a photodiode;
forming on the semiconductor substrate an amplifier having a first amplifier input coupled to the photosensor device, a second amplifier input coupled to a first reference voltage, and an amplifier output;
forming on the substrate a comparator having a first comparator input and a comparator output;
forming a feedback path between the comparator output and the first comparator input; and
forming on the substrate a capacitor adjacent the photodiode and having a first plate coupled to the amplifier output, and a second plate coupled to the first comparator input.

28. The method according to claim 27, further comprising forming on the semiconductor substrate reset circuitry configured to reset the amplifier and the comparator.

29. The method according to claim 28, wherein the amplifier and comparator are configured so that after reset thereof, output voltage at the amplifier output equals the first reference voltage plus an offset voltage, and a second voltage is at the first reference voltage.

30. An electronic device comprising:
a photosensor device comprising a photodiode;
an amplifier having a first amplifier input, a second amplifier input and an amplifier output, the amplifier configured to receive a charge from the photosensor device on the first amplifier input, receive a first reference voltage on the second amplifier input, and provide an output voltage on the amplifier output;
a comparator having a first comparator input, a second comparator input and a comparator output, the comparator configured to receive the output voltage on the first comparator input, receive the first reference voltage on the second comparator input, and provide a compare output on the comparator output;
a feedback path between the comparator output and the first comparator input;
a capacitor adjacent the photodiode and having a first plate and a second plate, the capacitor configured to have the first plate coupled to the amplifier output and the second plate coupled to the first comparator input;
reset circuitry coupled to the amplifier and comparator; and
circuitry having a first circuitry input and a second circuitry input, with the circuitry configured to have the comparator output received on the first circuitry input and a disable signal provided by the reset circuitry received on the second circuitry input.

31. The electronic device according to claim 30, wherein the amplifier and comparator are configured so that after reset thereof, the output voltage equals the first reference voltage plus an offset voltage, and a second voltage is at the first reference voltage.

32. The electronic device according to claim 30, wherein the feedback path comprises a switch configured to be controlled by the reset circuitry.

33. The electronic device according to claim 30, wherein the second comparator input is configured to receive one of the first reference voltage and a second reference voltage, with the second reference voltage being higher than the first reference voltage.

34. The electronic device according to claim 33, wherein the second reference voltage is used when the photosensor device is being read.

35. The electronic device according to claim 34, wherein the circuitry is configured to prevent the compare output from being used to provide a count value when the reference voltage on the second comparator input is being changed from the first to second reference voltage.

36. The electronic device according to claim 35, wherein the circuitry comprises a NOR gate.

* * * * *